(12) United States Patent
Kuroda et al.

(10) Patent No.: US 10,935,961 B2
(45) Date of Patent: Mar. 2, 2021

(54) WORKING SYSTEM

(71) Applicant: FUJI CORPORATION, Chiryu (JP)

(72) Inventors: Hideya Kuroda, Toyota (JP); Jun Iisaka, Nisshin (JP); Tadashi Yamamoto, Nishio (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/621,858

(22) PCT Filed: Jul. 20, 2017

(86) PCT No.: PCT/JP2017/026320
§ 371 (c)(1),
(2) Date: Dec. 12, 2019

(87) PCT Pub. No.: WO2019/016924
PCT Pub. Date: Jan. 24, 2019

(65) Prior Publication Data
US 2020/0103872 A1 Apr. 2, 2020

(51) Int. Cl.
*G05B 19/02* (2006.01)
*G05B 19/418* (2006.01)
(52) U.S. Cl.
CPC . *G05B 19/41835* (2013.01); *G05B 19/41815* (2013.01); *G05B 19/4183* (2013.01)
(58) Field of Classification Search
CPC ........ G05B 19/41835; G05B 19/41815; G05B 19/4183; G05B 19/4189; G05B 2219/31005; G05B 2219/45029; Y02P 90/04; Y02P 90/28; Y02P 90/285; H05K 13/081; H05K 13/0417; H05K 13/021
(Continued)

(56) References Cited

U.S. PATENT DOCUMENTS 5,036,935 A 8/1991 Kohara
10,682,762 B2 6/2020 Yamamoto

FOREIGN PATENT DOCUMENTS

JP 09-185413 A 7/1997
JP 2000-243808 A 9/2000
(Continued)

OTHER PUBLICATIONS

International Search Report dated Oct. 3, 2017 in PCT/JP2017/026320 filed Jul. 20, 2017, citing documents AP-AQ therein, 1 page.

*Primary Examiner* — Tanmay K Shah
(74) *Attorney, Agent, or Firm* — Oblon, McClelland, Maier & Neustadt, L.L.P.

(57) ABSTRACT

A working system includes multiple modules constituting a work line, a moving body that moves along the work line in which the multiple modules are arranged to supply necessary members to each module, and a line constituent member constituting a part of the work line. The line constituent member can be installed on the moving path of the moving body and has a light projecting section that projects light toward the moving body along the moving path of the moving body. The moving body has a sensor configured to detect the presence of an interfering object; a light receiving section configured to receive light from the light projecting section, and a control section configured to monitor for the presence of the interfering object within a detection range of the sensor.

3 Claims, 10 Drawing Sheets

(58) Field of Classification Search
USPC .......................................................... 340/4.3
See application file for complete search history.

(56) References Cited

FOREIGN PATENT DOCUMENTS

| | | | | |
|---|---|---|---|---|
| JP | 2000243808 | A | * | 9/2000 |
| JP | 2009-265792 | A | | 11/2009 |
| JP | 2009265792 | A | * | 11/2009 |
| WO | WO 2016/151724 | A1 | | 1/2018 |

* cited by examiner

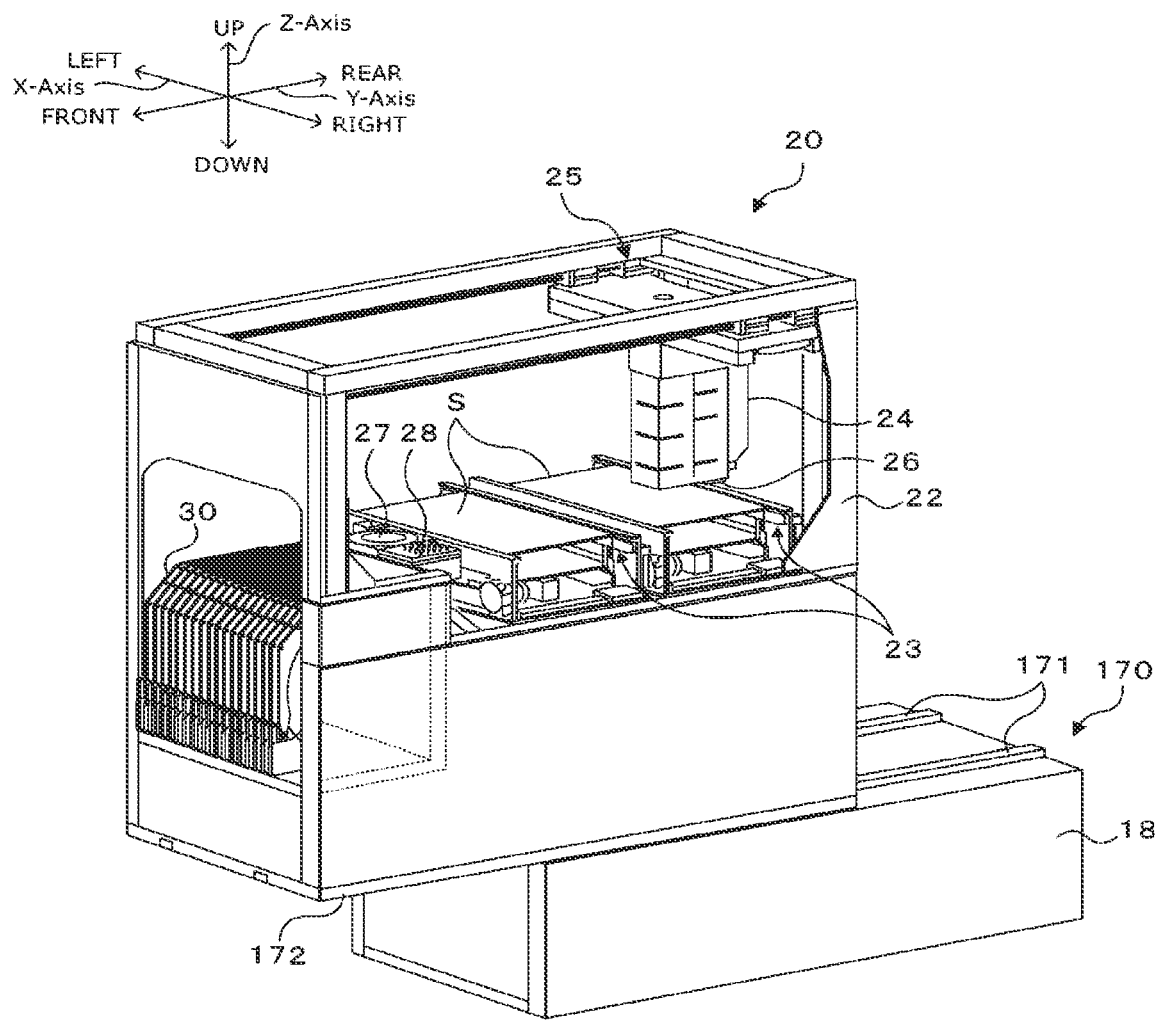

WORKING SYSTEM

TECHNICAL FIELD

This specification discloses a working system.

BACKGROUND ART

Conventionally, there has been known a system consisting of a moving body provided with a sensor for detecting an obstacle. For example, Patent Literature 1 discloses an unmanned vehicle (moving body) for conveying a wagon cart in which the periphery of the wagon cart is constantly monitored by a proximity detection device, and when the proximity detection device detects an obstacle coming into close proximity while the wagon cart is being conveyed by the unmanned vehicle, the movement of the unmanned vehicle is stopped. In the unmanned vehicle provided with the proximity detection device, the unmanned vehicle enlarges the range for detecting an obstacle by extending the proximity detection device in the width direction or the upper direction while the wagon cart is being conveyed.

PATENT LITERATURE

Patent Literature 1: JP-A-09-185413

BRIEF SUMMARY OF THE INVENTION

Technical Problem

In a working system in which a work line is formed by arranging multiple modules, a moving body moves along the line and supplies necessary members to each module. The moving body includes a sensor for detecting the presence of an interfering object, and if an interfering object within a predetermined detection range is detected by the sensor while the moving body is moving, the movement of the moving body is stopped. However, in a working system in which a line constituent member constituting a part of a work line is installed in the moving path of the moving body, if a detection range of a sensor is enlarged to ensure safety, and the movement of the moving body is stopped due to the line constituent member entering the detection range of the sensor, there are cases in which the moving body cannot proceed further in the direction approaching the line constituent member causing replenishment work to be delayed.

It is a main object of the present disclosure to provide a working system capable of properly performing the operation of replenishing necessary members to each module and detecting interfering objects even when a line constituent member is present on the moving path of the moving object.

Solution to Problem

The present disclosure employs the following means in order to achieve the above-mentioned main object.

The working system of the present disclosure comprises: multiple modules constituting a work line; a moving body configured to move alongside a line in which multiple modules are lined up to replenish necessary members to each of the modules; and a line constituent member constituting a part of the work line, wherein the line constituent member is installable on the moving path of the moving body and has a light projecting section configured to project light toward the moving body along the moving path of the moving body; wherein the moving body is further comprised of: a sensor configured to detect presence of an interfering object, a light receiving section configured to receive light from the light projecting section, and a control section configured to monitor for the presence of the interfering object within a detection range of the sensor and, in a case of the line constituent member being installed on the moving path of the moving body, the control section stops the movement of the moving body when the interfering object is detected while monitoring for the presence of the interfering object on the moving path to the line constituent member based on a state of light received from the light receiving section; wherein the control section is capable of switching the detection range of the sensor between a first detection range and a second detection range that is smaller than the first detection range.

The working system of the present disclosure comprises multiple modules, a vehicle, and a line constituent member. The line constituent member can be installed on the moving path of the moving body and has a light projecting section that projects light toward the moving body along the moving path of the moving body. The moving body has a sensor configured to detect the presence of an interfering object, a light receiving section configured to receive light from the light projecting section, and a control section configured to monitor for the presence of the interfering object within a detection range of the sensor and, in a case of the line constituent member being installed on the moving path of the moving body, the control section stops the movement of the moving body when the interfering object is detected while monitoring for the presence of the interfering object on the moving path to the line constituent member based on a state of light received from the light receiving section. The control section can switch the detection range of the sensor between the first detection range and the second detection range which is smaller than the first detection range. With this configuration, when the detection range of the sensor is set to the second detection range, it becomes difficult for the sensor to detect the line constituent member as an interfering object, making it possible for the moving body to move to the vicinity of the line constituent member to continue the replenishment operation. In addition, since the moving body monitors for the presence of an interfering object on the moving path between the moving body and the line constituent member based on the state of light received from the light receiving section instead of the sensor, the moving body adequately detects an interfering object on the moving path. As a result, the working system can adequately perform replenishment work of necessary members to each module and detect an interfering object even when a line constituent member is present on the moving path of the moving body.

BRIEF DESCRIPTION OF DRAWINGS

FIG. 9 A diagram showing a schematic configuration of extraction device 170.

DESCRIPTION OF EMBODIMENTS

Next, an embodiment of the present disclosure will be described with reference to the drawings.

Figure 1:
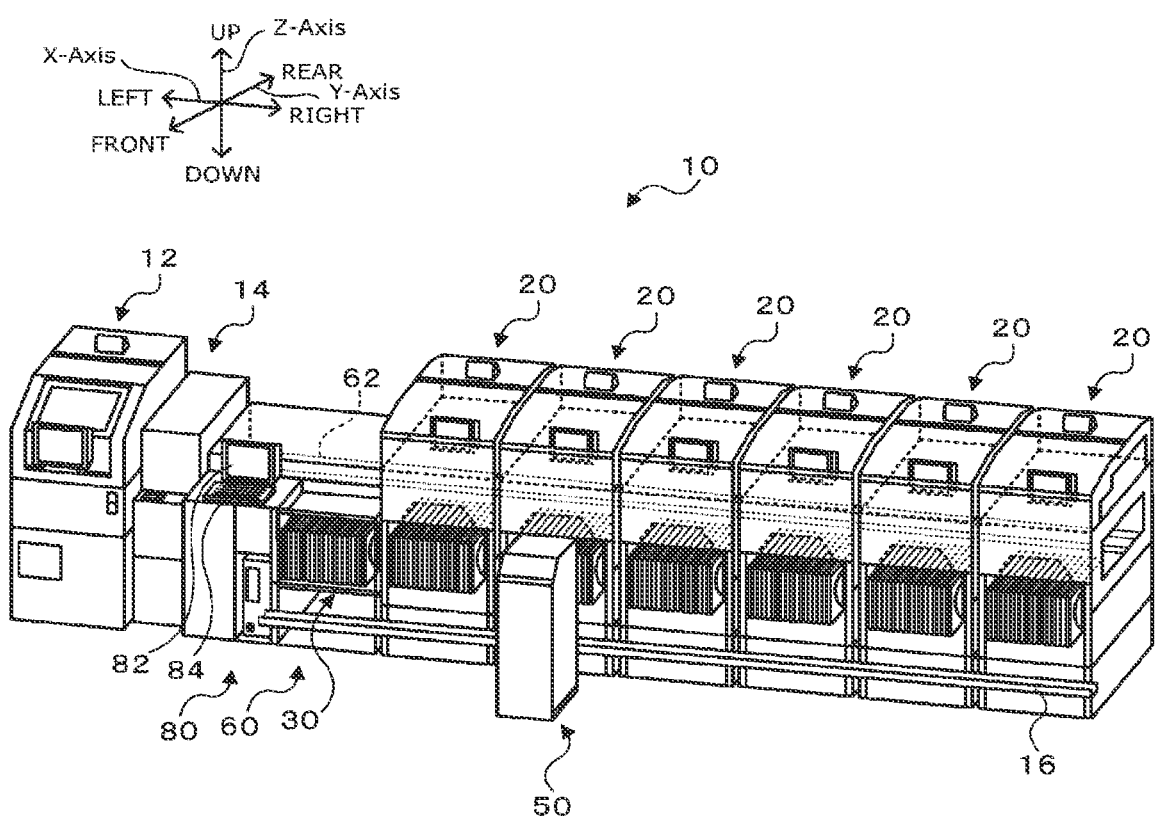
FIG. 1 A diagram showing a schematic configuration of component mounting system 10 of the present embodiment.
Figure 2:
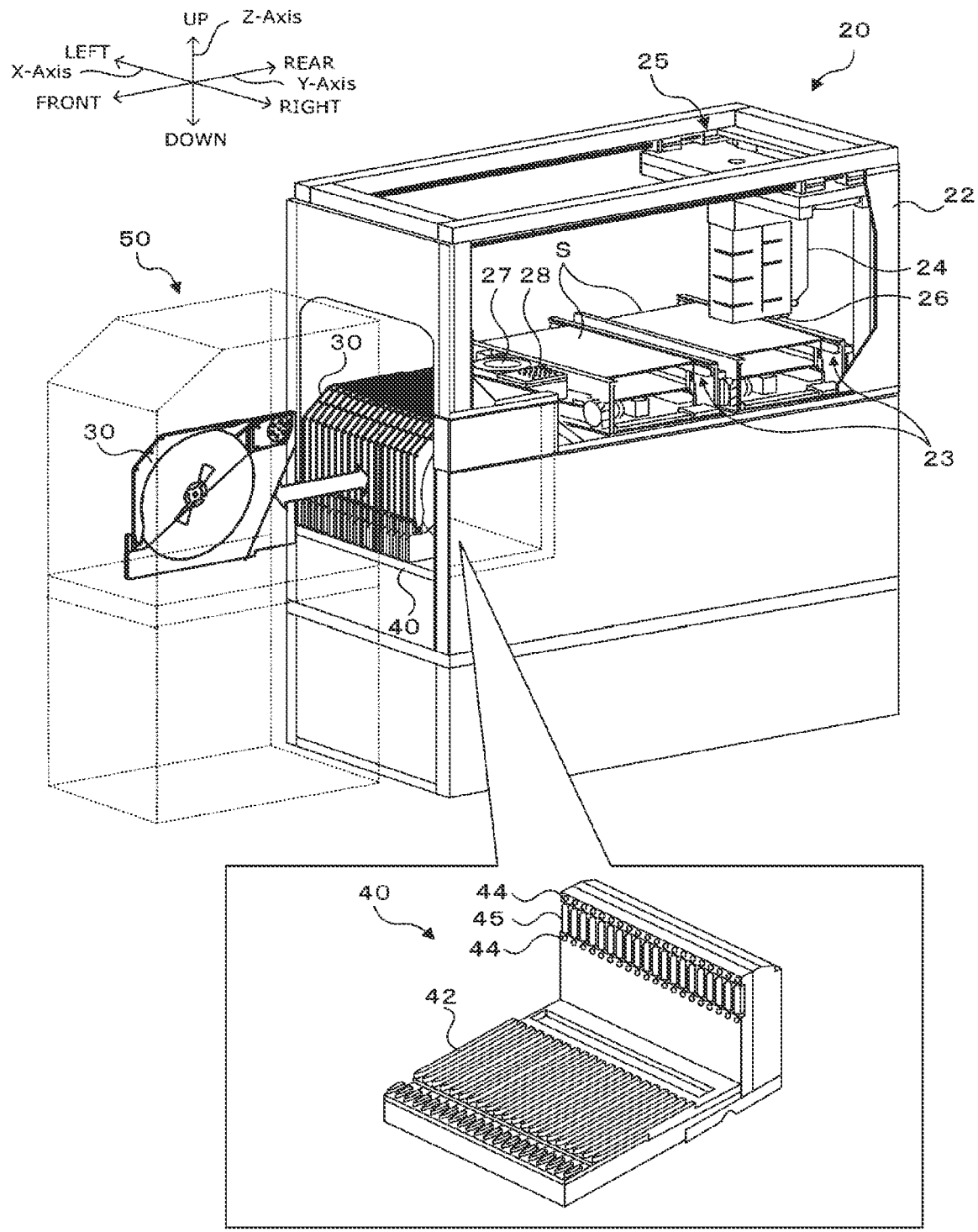
FIG. 2 A diagram showing a schematic configuration of component mounting device 20.
Figure 3:
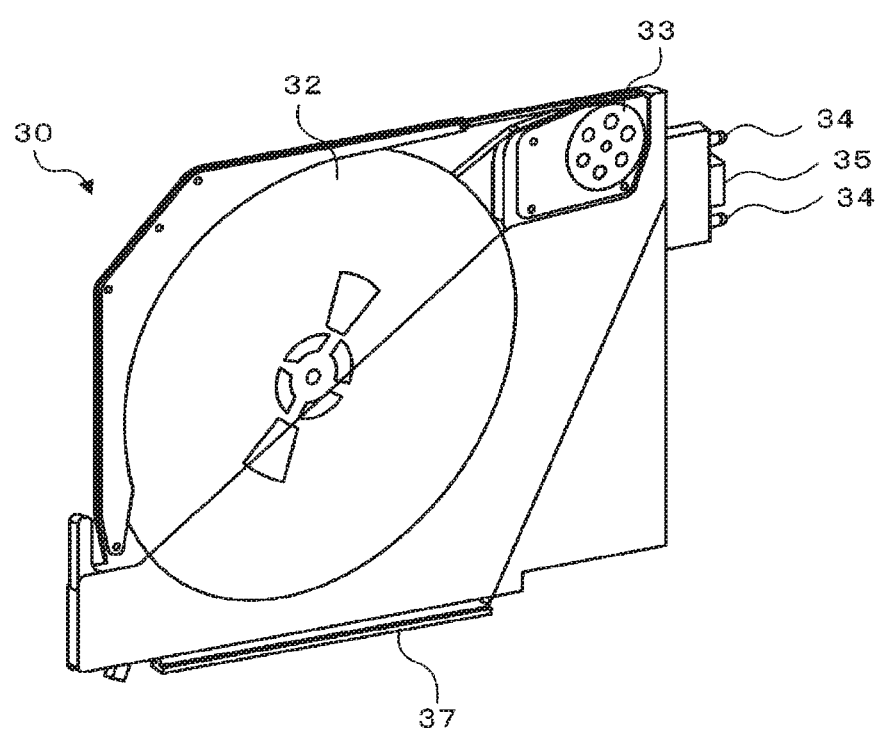
FIG. 3 A diagram showing a schematic configuration of tape feeder 30.
Figure 4:
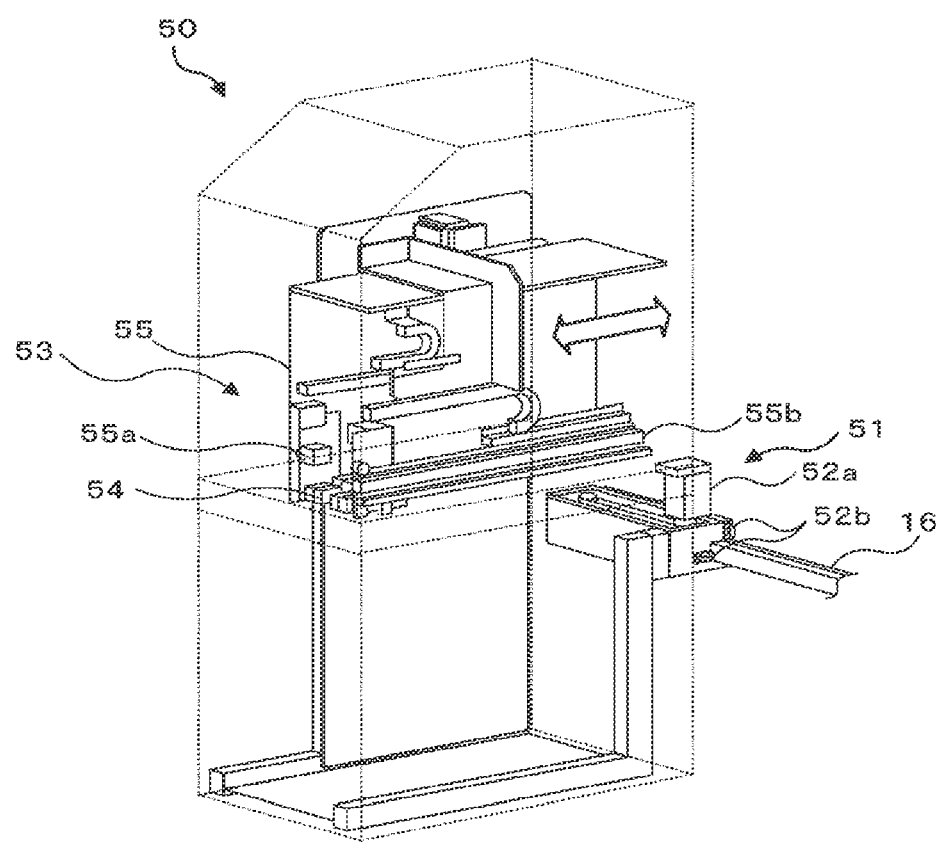
FIG. 4 A diagram showing a schematic configuration of loader 50.
Figure 5:
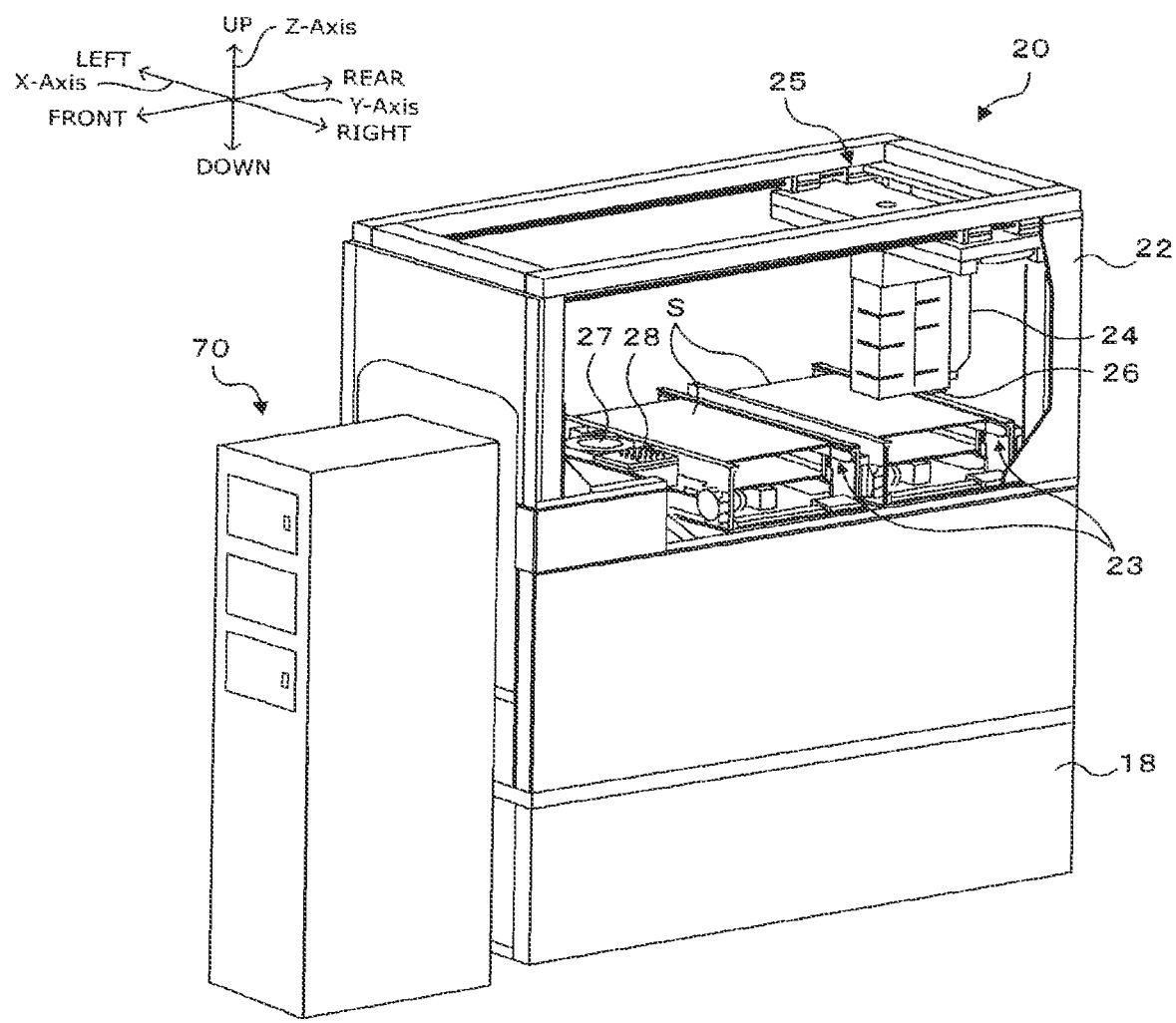
FIG. 5 A diagram showing a schematic configuration of tray feeder 70.
Figure 6:
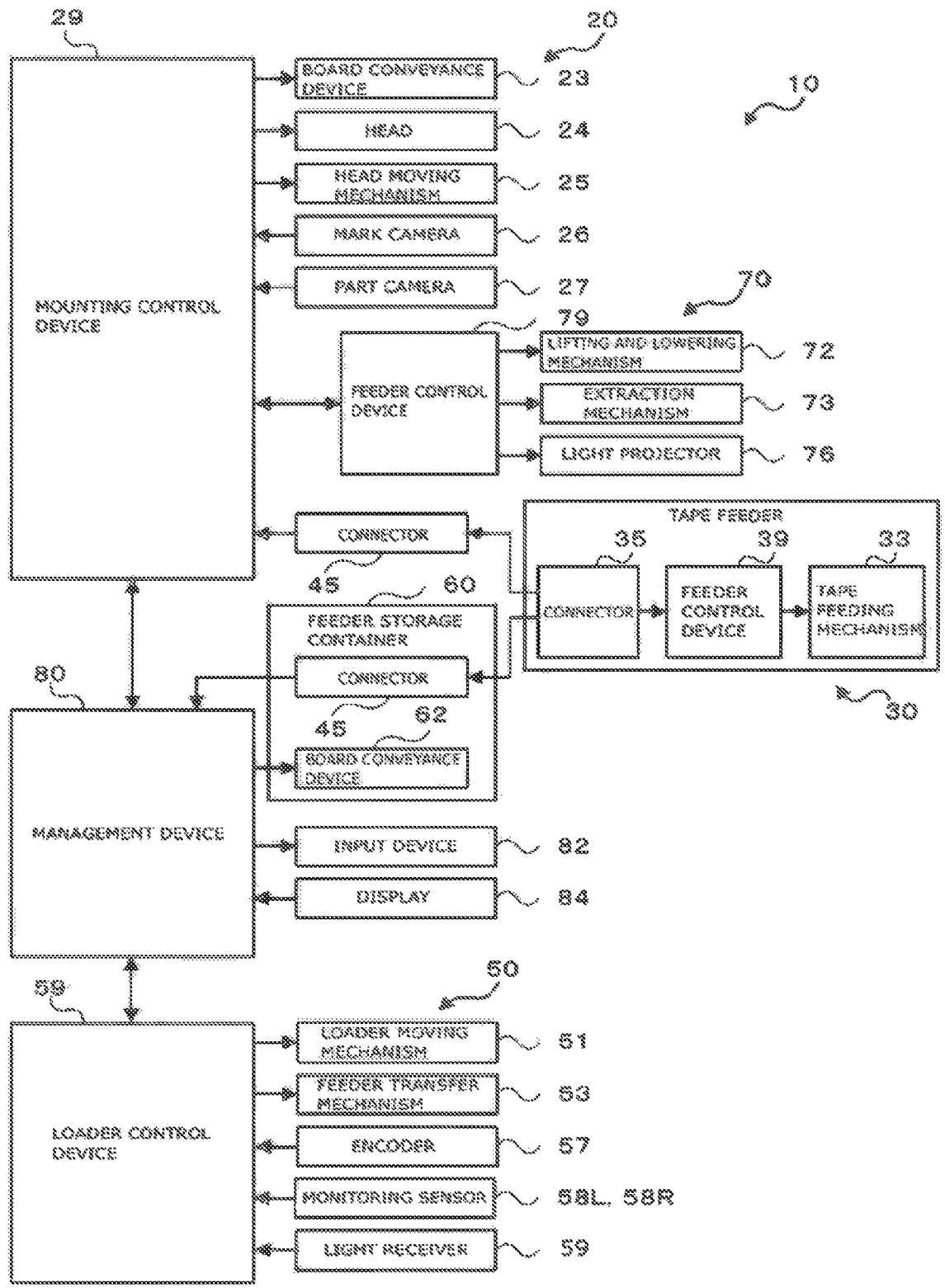
FIG. 6 A diagram showing electrical connections between mounting control device 29, loader control device 59, and management device 80.

FIG. 1 is a diagram showing a schematic configuration of component mounting system 10 of the present embodiment. FIG. 2 is a diagram showing a schematic configuration of component mounting device 20. FIG. 3 is a diagram showing a schematic configuration of tape feeder 30. FIG. 4 is a diagram showing a schematic configuration of loader 50. FIG. 5 is a diagram showing a schematic configuration of tray feeder 70. FIG. 6 is a diagram showing electrical connections of mounting control device 29, loader control device 59, and management device 80. In FIGS. 1 and 2, the left-right direction is the X-axis direction, the front-rear direction is the Y-axis direction, and the up-down is the Z-axis direction.

As shown in FIG. 1, component mounting system 10 includes printer 12, printing inspector 14, multiple component mounting devices 20, mounting inspection machine (not shown), loader 50, feeder storage container 60, tray feeder 70 (refer to FIG. 5), and management device 80. Printer 12 prints solder on board S. Printing inspector 14 inspects the state of solder printed by printer 12. Component mounting device 20 is aligned along the conveyance direction (X-direction) of board S and mounts components supplied from tape feeder 30 and tray feeder 70 on board S. The print inspector inspects the mounting state of components mounted by component mounting device 20. Loader 50 supplies necessary tape feeders 30 to multiple component mounting devices 20 and collects used tape feeders 30 from component mounting devices 20. Feeder storage container 60 is capable of storing tape feeders 30 to be used in component mounting device 20 and used tape feeders 30. Tray feeder 70 is configured to be detachable from component mounting device 20 and supplies trays, in which multiple components are accommodated, to component mounting device 20. Management device 80 manages the entire system. Printer 12, printing inspector 14, and multiple component mounting devices 20 are arranged side by side in the conveyance direction of board S in this order to constitute a production line. Feeder storage container 60 is incorporated in the production line of component mounting system 10, and is installed between component mounting device 20 and printing inspector 14 on the most upstream side in the conveyance direction of the board among the multiple component mounting devices 20.

As shown in FIG. 2, component mounting device 20 includes board conveyance device 23 for conveying board S from left to right, head 24 having a suction nozzle for sucking components supplied by tape feeder 30, head moving mechanism 25 for moving head 24 in the front-rear direction and the left-right direction (XY direction), and mounting control device 29 (refer to FIG. 6) for controlling the entire device. Component mounting device 20 further includes mark camera 26, part camera 27, nozzle station 28, and the like. Mark camera 26 is attached to head 24 and images a reference mark, attached to board S, from above. Part camera 27 is installed between tape feeder 30 and board conveyance device 23 and images the component from below when the suction nozzle, which has picked up a component, passes above part camera 27. Nozzle station 28 accommodates multiple types of suction nozzles in an interchangeable manner depending on the type of component to be picked up. Mounting control device 29 is composed of a well-known CPU, ROM, RAM, and the like. Image signals from mark camera 26 and part camera 27 are inputted to mounting control device 29. Mounting control device 29 processes the image of board S captured by mark camera 26 and recognizes the position of the board mark (not shown) attached to board S, and in this way recognizes the position of board S. In addition, mounting control device 29 determines whether a component is picked up by the suction nozzle based on the image captured by part camera 27, and determines the suction position and the suction orientation of the component. Mounting control device 29 outputs drive signals to board conveyance device 23, head 24, head moving mechanism 25, and the like. Mounting control device 29 performs a suction operation in which head 24 and head moving mechanism 25 are controlled so that the component supplied by tape feeder 30 and tray feeder 70 are picked up by the suction nozzle. In addition, mounting control device 29 performs a mounting operation in which head 24 and head moving mechanism 25 are controlled so that the component picked up by the suction nozzle is mounted on board S.

As shown in FIG. 3, tape feeder 30 includes tape reel 32, tape feeding mechanism 33, connector 35, rail member 37, and feeder control device 39 (see FIG. 6). A tape is wound around tape reel 32. The tape has multiple recesses at predetermined intervals along the longitudinal direction. Each recess accommodates a component. These components are protected by a film covering the surface of the tape. Tape feeding mechanism 33 feeds the tape from tape reel 32. Tape feeder 30 drives tape feeding mechanism 33 to feed the tape rearward by a predetermined amount, thereby sequentially supplying the components accommodated in the tape to a component supply position. The components accommodated in the tape are exposed at the component supply position by peeling off the film before the component supply position and are picked up by the suction nozzle. Connector 35 has two positioning pins 34 protruding toward the attaching direction. Rail member 37 is provided at the lower edge of tape feeder 30 and extends in the attaching direction. Feeder control device 39 includes a well-known CPU, ROM, RAM, and the like, and outputs a drive signal to tape feeding mechanism 33. Feeder control device 39 can communicate with a control section (e.g., mounting control device 29 or management device 80) to which tape feeder 30 is attached via connector 35.

As shown in FIG. 2, tape feeder 30 is detachably attached to feeder table 40 provided in front of component mounting device 20. Multiple feeder tables 40 are arranged in the X-direction, and tape feeders 30 are attached so as to be aligned in the X-direction. Feeder table 40 is an L-shaped table in the side view, and includes slots 42, two positioning holes 44, and connectors 45. Rail member 37 of tape feeder 30 is inserted into slot 42. Two positioning pins 34 of tape feeder 30 are inserted into two positioning holes 44, and thus positions tape feeder 30 in feeder table 40. Connector 45 is provided between the two positioning holes 44 and connects to connector 35 of tape feeder 30.

Loader 50 is movable along X-axis rail 16 provided on the front face of multiple component mounting devices 20 and feeder storage container 60, in parallel with the board conveyance direction (X-axis direction). In FIG. 2, X-axis rail 16 is not shown.

As shown in FIG. 4, loader 50 includes loader moving mechanism 51, feeder transfer mechanism 53, encoder 57 (refer to FIG. 6), left and right monitoring sensors 58L, 58R (see FIG. 6), light receiver 56 (see FIG. 6), and loader control device 59 (see FIG. 6). Loader moving mechanism 51 moves loader 50 along X-axis rail 16 and includes an X-axis motor 52a, such as a servo motor for driving a driving belt, and guide roller 52b for guiding the movement of loader 50 along X-axis rail 16. Feeder transfer mechanism 53 transfers tape feeder 30 to component mounting device 20 or feeder storage container 60, and includes clamp section 54 for clamping tape feeder 30 and a Y-axis slider 55 for moving clamp section 54 along Y-axis guide rail 55b. Y-axis slider 55 includes Y-axis motor 55a and moves clamp section 54 in the front-rear direction (i.e., the Y-axis direction) with driving Y-axis motor 55a. Encoder 57 detects the movement position of loader 50 in the X-direction. Monitoring sensors 58L, 58R monitor for the presence of an interfering object, and laser scanners can be used for this purpose. Monitoring sensors 58L, 58R can switch the sensor monitoring area between area 1 and area 2 smaller than area 1, both of which will be described later, by switching a scanning range. Left monitoring sensor 58L is attached to the left side of loader 50 (i.e., the side opposite to the conveyance direction of board S) and is able to detect an interfering object mainly on the left of loader 50. Right monitoring sensor 58R is attached to the right side of loader 50 (i.e., the same side as the conveyance direction of board S) and is capable of detecting an interfering object mainly on the right of loader 50. Light receiver 56 is configured with safety curtain SC by being combined with light projector 76 installed in tray feeder 70, which will be described later, and monitors for the presence of an interfering object between light projector 76 and light receiver 56. Light receiver 56 and light projector 76 are arranged so as to face each other in series. Loader control device 59 is composed of a well-known CPU, ROM, RAM, and the like, receives detection signals from encoder 57, monitoring sensors 58L, 58R, and light receiver 56, and outputs drive signals to loader moving mechanism 51 (i.e., X-axis motor 52a) and feeder transfer mechanism 53 (i.e., clamp section 54 and Y-axis motor 55a).

When attaching tape feeder 30 from inside loader 50 into component mounting device 20, loader control device 59 first controls X-axis motor 52a to move loader 50 to a position facing component mounting device 20 to which tape feeder 30 is to be attached. Next, loader control device 59 causes clamping section 54 to clamp tape feeder 30. Loader control device 59 then causes Y-axis motor 55a to move Y-axis slider 55 rearward (i.e., to the component mounting device 20 side), inserts rail member 37 of tape feeder 30 into slot 42 of feeder table 40, and causes clamp section 54 to release the clamp of tape feeder 30. As a result, tape feeder 30 becomes attached to feeder table 40 of component mounting device 20.

When tape feeder 30 is detached from component mounting device 20 and collected in loader 50, loader control device 59 first causes X-axis motor 52a to move loader 50 to a position facing component mounting device 20 to which tape feeder 30 to be collected is attached. Next, loader control device 59 causes tape feeder 30 attached to feeder table 40 to be clamped by clamping section 54. Loader control device 59 then causes Y-axis motor 55a to move Y-axis slider 55 forward (i.e., toward loader 50). As a result, tape feeder 30 is removed from feeder table 40 and collected in loader 50.

Feeder storage container 60 is provided with multiple feeder tables 40, each having the same configuration as feeder table 40 provided in component mounting device 20, to accommodate multiple tape feeders 30. Feeder tables 40 of feeder storage container 60 are provided at the same height (i.e., position in the Z-direction) as feeder table 40 of component mounting device 20. Therefore, loader 50 can attach and detach tape feeder 30 to and from feeder table 40 of feeder storage container 60 with the same operation as attaching and detaching tape feeder 30 to and from feeder table 40 of component mounting device 20 at the position facing feeder storage container 60.

Board conveyance device 62 for conveying board S in the X-direction is provided behind feeder storage container 60. Board conveyance device 62 is disposed at the same position, in the front-rear direction and vertical direction, as the board conveyance device (not shown) of printing inspector 14 and board conveyance device 23 of adjacent component mounting device 20. For this reason, board conveyance device 62 can receive board S from the board conveyance device of printing inspector 14 and can convey the received board S to board conveyance device 23 of the adjacent component mounting device 20.

Tray feeder 70 includes a magazine (not shown) capable of vertically accommodating multiple trays, lifting and lowering mechanism 72 for lifting and lowering the magazine, extraction mechanism 73 for extracting the tray from the magazine to a component supply position at a predetermined lifting position, light projector 76, and feeder control device 79. When the tray is extracted out to the component supply position by extraction mechanism 73, the component accommodated in the tray can be picked up by the suction nozzle of component mounting device 20. Light projector 76 is configured to project light toward loader 50 along the traveling path of loader 50, with safety curtain SC being configured by combining loader 50 with light receiver 56 described above. Feeder control device 79 includes a well-known CPU, ROM, RAM, and the like, and outputs drive signals to lifting and lowering mechanism 72, extraction mechanism 73, and light projector 76. When tray feeder 70 is attached to component mounting device 20, feeder control device 79 is communicably connected to mounting control device 29 of mounted component mounting device 20. Feeder control device 79 receives a request signal for requesting a component from mounting control device 29 and outputs information on the type and remaining number of components accommodated in each tray to mounting control device 29.

Tray feeder 70 is attached to the front face of component mounting device 20. When attached to component mounting device 20, tray feeder 70 protrudes forward from component mounting device 20 and blocks the traveling path of loader 50.

Management device 80 is a general-purpose computer, and as shown in FIG. 6, receives a signal from input device 82 operated by an operator, outputs an image signal to display 84, and outputs a drive signal to board conveyance device 62 that conveys board S. Production job data is stored in the memory of management device 80. In the production job data, in each component mounting device 10, which components are mounted on which board S, in which order, how many boards S mounted in this manner are manufactured, and the like are determined. Management device 80 is communicably connected to mounting control device 29 by wire and communicably connected to loader control device 59 wirelessly, receives information on the mounting state of component mounting device 20 from mounting control device 29, and receives information on the driving state of loader 50 from loader control device 59. In addition, management device 80 is also communicably connected to the respective control devices of printer 12, printing inspector 14, and the mounting inspector, and receives various types of information from the corresponding devices.

Management device 80 also manages feeder storage container 60. Management device 80 is communicably connected to feeder control device 39 of tape feeder 30 attached to feeder table 40 of feeder storage container 60 via connectors 35, 45. Management device 80 stores storage information including the attaching position and identification information of tape feeder 30 stored in feeder storage container 60, the type of accommodated components, the number of components remaining, and the like. Management device 80 updates the storage information to the latest information when tape feeder 30 is removed from feeder storage container 60 or when a new tape feeder 30 is attached to feeder storage container 60.

Figure 7:
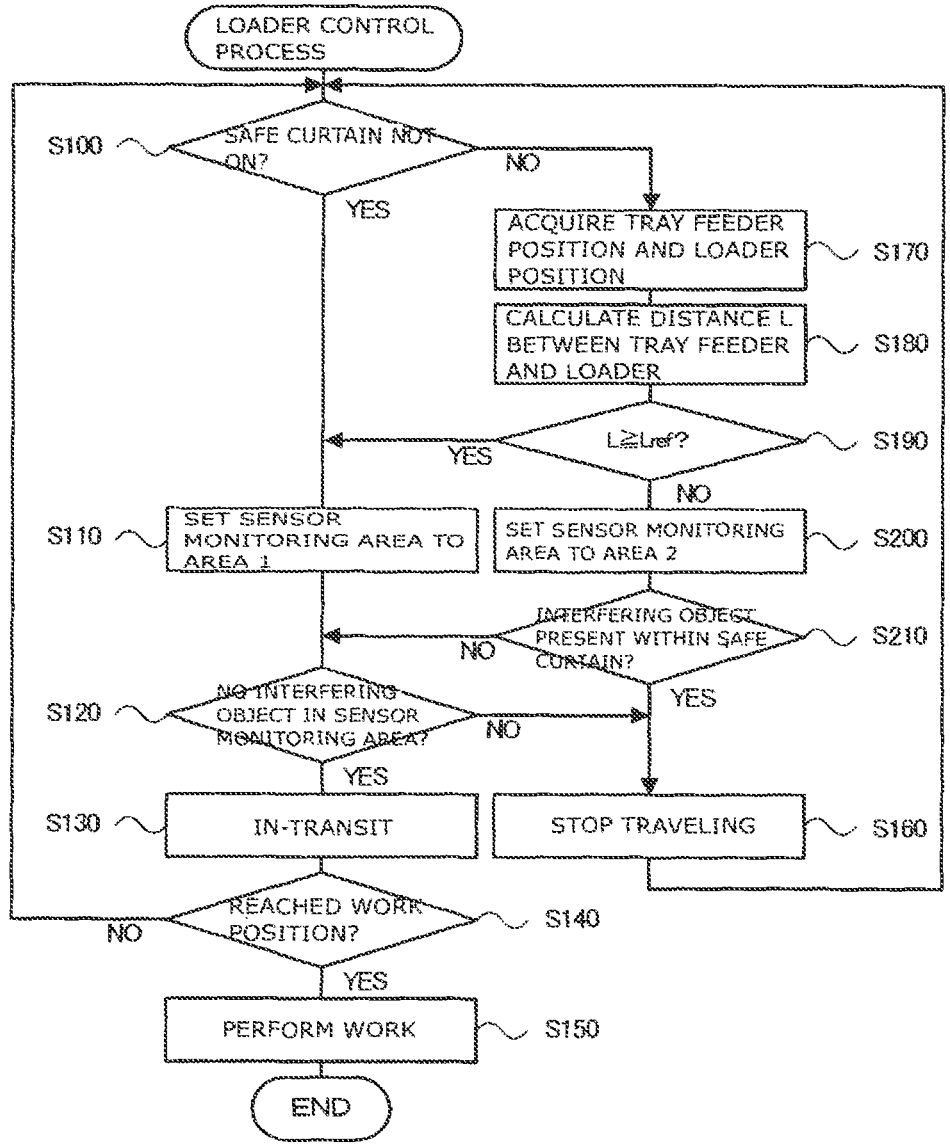
FIG. 7 A flow chart showing an example of a loader control process.

The operation of component mounting system 10 configured as described above, in particular, the operation of loader 50 will be described. FIG. 7 is a flowchart showing an example of a loader control process executed by loader control device 59. This process is performed when there is an instruction to attach or collect tape feeder 30 at any of the multiple component mounting devices 20.

When the loader control process is executed, loader control device 59 first determines whether light (safety curtain SC) from light projector 76 is detected by light receiver 56, that is, whether tray feeder 70 is present on the traveling path of loader 50 (S100). When it is determined that safety curtain SC is not detected, that is, when it is determined that tray feeder 70 is not present on the traveling path of loader 50, loader control device 59 sets the sensor monitoring area to area 1 (S110). Next, loader control device 59 determines whether an interfering object is detected in the sensor monitoring area of monitoring sensors 58L, 58R (S120). Since the sensor monitoring area is area 1, the process of S120 is a process for determining whether an interfering object is detected in area 1. When it is determined that an interfering object is not detected in the sensor monitoring area, loader control device 59 causes loader moving mechanism 51 to travel toward the work position (S130) and determines whether the work position has been reached based on a signal from encoder 57 (S140). When it is determined that the work position has not been reached, loader control device 59 returns to S100 and repeats the process, and when it is determined that the work position has been reached, loader control device 59 performs work according to instructions (i.e., attachment work and collection work of tape feeder 30) (S150) and ends the loader control process. When it is determined that an interfering object is detected in the sensor monitoring area in S120, loader control device 59 causes loader moving mechanism 51 to stop traveling (S160) and returns to S100. After stopping the traveling of loader 50, loader control device 59 proceeds to S130 and resumes causing loader moving mechanism 51 to travel toward the work position when it is determined that an interfering object is no longer detected in loader control area in S120.

When it is determined that safety curtain SC is detected in S100, that is, when it is determined that tray feeder 70 is present along the traveling path of loader 50, loader control device 59 acquires the position of loader 50 and the position of tray feeder 70 (S170). The position of tray feeder 70 can be derived based on a signal received from component mounting device 20, to which tray feeder 70 is attached, via management device 80. The position of loader 50 can be derived based on a signal from encoder 57. Loader control device 59 then calculates (S180) the distance between tray feeder 70 and loader 50 (i.e., tray feeder-loader distance L), based on the acquired position of tray feeder 70 and the position of loader 50, and determines whether calculated tray feeder-loader distance L is equal to or greater than predetermined distance Lref (S190). Here, predetermined distance Lref is set as a distance which is longer than the distance at which loader 50 can detect tray feeder 70, installed on the traveling path, can be detected as an interfering object in area 1. When it is determined that tray feeder-loader distance L is predetermined distance Lref or more, loader control device 59 sets the sensor monitoring area to area 1 (S110) and proceeds to S120 described above. On the other hand, when it is determined that tray feeder-loader distance L is less than predetermined distance Lref, loader control device 59 sets the sensor monitoring area to area 2, which is smaller than area 1 and in which tray feeder 70 is not detected (S200). When the sensor monitoring area is set to area 2, loader control device 59 determines whether an interfering object is detected in safety curtain SC (S210) and whether an interfering object is detected in loader management area with monitoring sensors 58L, 58R (S120) based on a signal from light receiver 56. When it is determined that an interfering object is not detected in neither safety curtain SC nor the sensor monitoring area (area 2), loader control device 59 causes loader moving mechanism 51 to travel toward the work position (S130). On the other hand, when it is determined that an interfering object is detected in either safety curtain SC or the sensor monitoring area (area 2), loader control device 59 stops the traveling of loader moving mechanism 51 until the interfering object is no longer detected (S160).

Figure 8A:
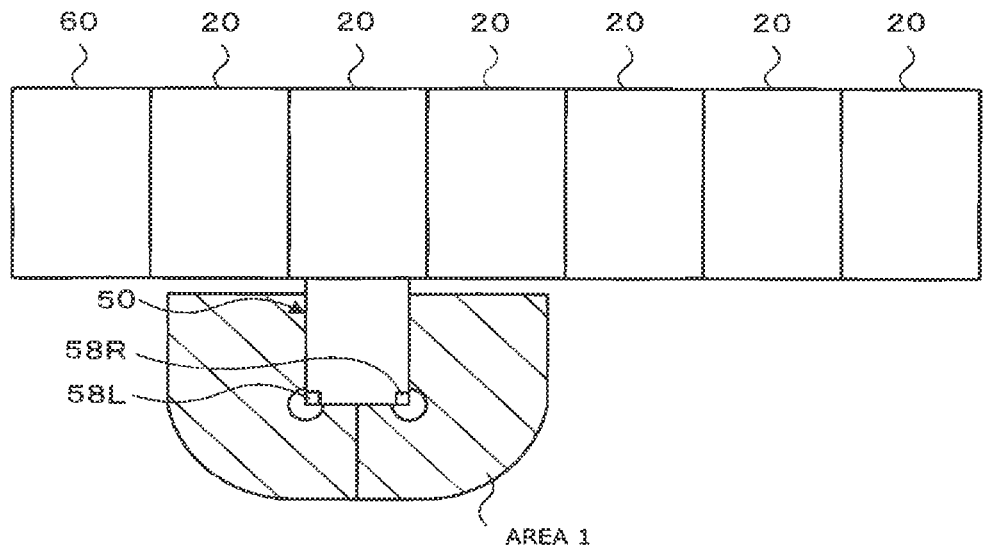
FIG. 8A A diagram showing sensor monitoring areas.
Figure 8B:
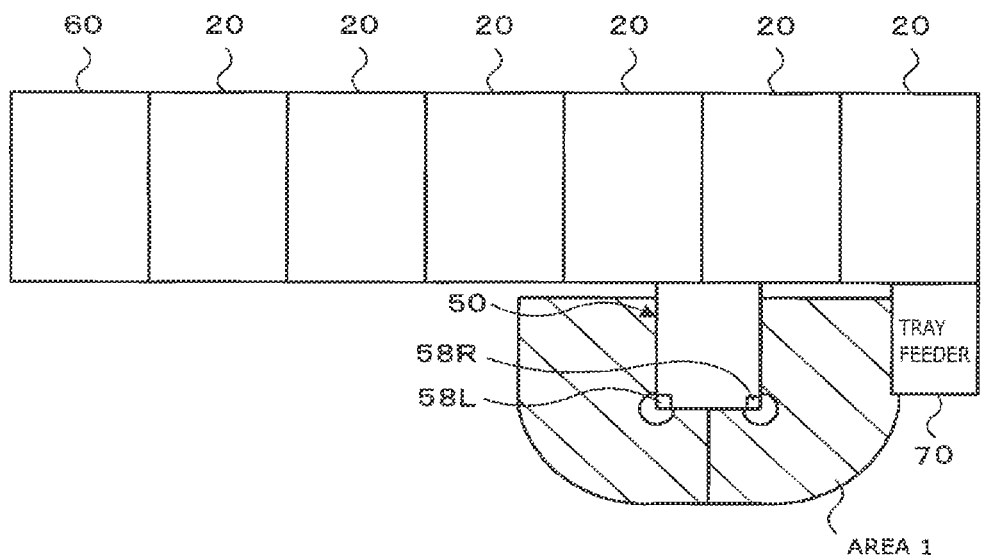
FIG. 8B A diagram showing sensor monitoring areas.
Figure 8C:
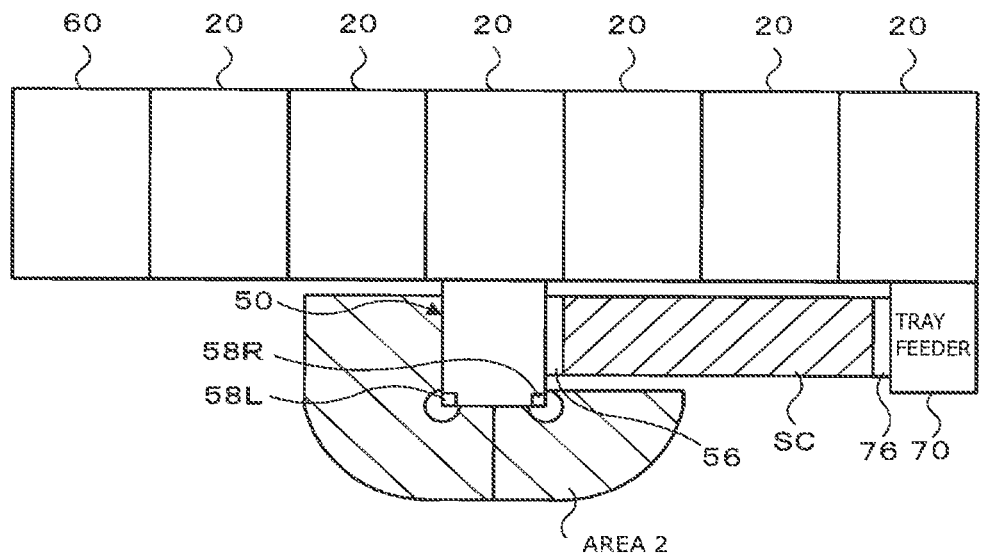
FIG. 8C A diagram showing sensor monitoring areas.
Figure 8D:
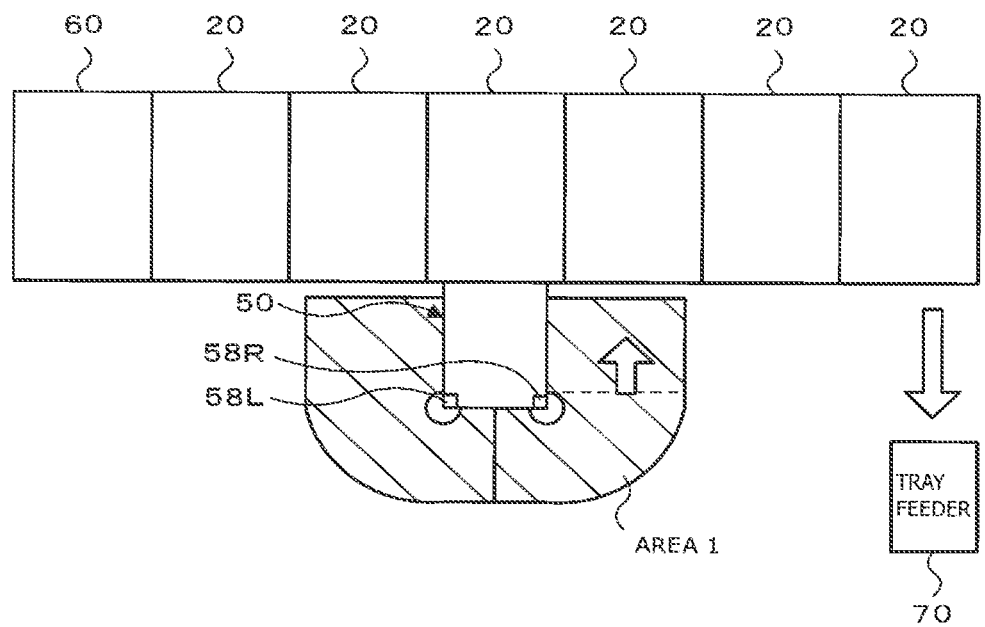
FIG. 8D A diagram showing sensor monitoring areas.

FIGS. 8A to 8D are diagrams showing sensor monitoring areas. As shown in FIG. 8A, when tray feeder 70 is not present along the traveling path, loader 50 sets the sensor monitoring area to area 1 to ensure safety and monitors for the presence of interfering object in area 1. On the other hand, when tray feeder 70 is present on the traveling path, loader 50 detects tray feeder 70 as an interfering object and stops the traveling, as shown in FIG. 8B, as long as the interfering object continues to be detected in area 1, thereby disabling attachment and collection of tape feeder 30 at component mounting device 10 in the vicinity of tray feeder 70. Therefore, in component mounting system 10, as shown in FIG. 8C, when tray feeder 70 is installed on the traveling path of loader 50, the monitoring area of monitoring sensors 58L, 58R is switched from area 1 to area 2 in which tray feeder 70 is not detected, and the space between loader 50 and tray feeder 70 is monitored with safety curtain SC between light projector 76 installed in tray feeder 70 and light receiver 56 installed in loader 50 instead of monitoring sensors 58L, 58R. As a result, since loader 50 does not detect tray feeder 70 as an interfering object with monitoring sensors 58L, 58R, it becomes possible to approach the vicinity of tray feeder 70 and execute work. Further, loader 50 can detect an interfering object between loader 50 and tray feeder 70 with safety curtain SC (i.e., light receiver 56) and can ensure adequate safety. As shown in FIG. 8D, when tray feeder 70 is detached from the production line (i.e., component mounting device 20) and safety curtain SC is turned off, loader 50 switches the sensor monitoring area from area 2 back to area 1. As described above, loader 50 automatically switches the monitoring area of monitoring sensors 58L, 58R to area 1 or area 2 depending on whether tray feeder 70 is present on the traveling path, thereby enabling operation even in the vicinity of tray feeder 70 while ensuring safety. If loader 50 continues traveling when tray feeder 70 is removed from the production line and the sensor monitoring area is switched from area 2 back to area 1, a gap may temporarily occur in the monitoring. Therefore, even when tray feeder 70 is present along the traveling path, loader 50 sets the sensor monitoring area to area 1 when distance L between the tray feeder and the loader is equal to or greater than predetermined distance Lref.

Here, the correspondence between the main elements of the embodiment and the main elements of the present disclosure described in the claims will be described. That is, component mounting system 10 of the embodiment corresponds to a working system of the present disclosure, component mounting device 20 corresponds to a module, tray feeder 70 corresponds to a line constituent member, light projector 76 corresponds to a light projecting section, loader 50 corresponds to a moving body, monitoring sensors 58L, 58R correspond to sensors, light receiver 56 corresponds to a light receiving section, and feeder control device 59 corresponds to a control section. Component mounting device 20 corresponds to a component mounting device, and tray feeder 70 corresponds to a component supply device.

The working system (component mounting system 10) of the embodiment described above includes multiple component mounting devices 20 (modules), loader 50 (moving body), and tray feeder 70 (line constituent member). Tray feeder 70 can be installed along the traveling path of loader 50 and includes light projector 76 for projecting light toward loader 50 along the traveling path of loader 50. Loader 50 stops traveling when an interfering object is detected while loader 50 is traveling during the monitoring for the presence of an interfering object within the monitoring area of monitoring sensors 58L, 58R which detect the presence of an interfering object and light receiver 56 which receives light from light projector 76 in addition to the monitoring for the presence of an interfering object within the traveling path between loader 50 and tray feeder 70 based on the state of light received by light receiver 56 in the case where tray feeder 70 is installed on the traveling path of loader 50. Loader control device 59 can switch the monitoring area of monitoring sensors 58L, 58R between area 1 and area 2, which is smaller than area 1. As a result, when the monitoring area of monitoring sensors 58L, 58R is set to area 2, since monitoring sensors 58L, 58R do not detect tray feeder 70 as an interfering object, loader 50 can travel to the vicinity of tray feeder 70 and continue work. In addition, since loader 50 monitors for the presence of an interfering object on the traveling path between loader 50 and tray feeder 70 based on the state of light received by light receiver 56 instead of monitoring sensors 58L, 58R, it is possible to adequately detect the interfering object on the traveling path. As a result, even when tray feeder 70 is present on the traveling path of loader 50, the working system can adequately perform the work of replenishing necessary members to component mounting devices 20 and detecting interfering objects.

In the working system of the embodiment, loader control device 59 sets the monitoring area of monitoring sensors 58L, 58R to area 1 when light receiver 56 is not receiving light from light projector 76 and sets the monitoring area to area 2 when light receiver 56 is receiving light from light projector 76. As a result, loader control device 59 can easily determine the presence of tray feeder 70 on the traveling path of loader 50.

In addition, loader control device 59 sets the monitoring area as area 1 when the distance between loader 50 and tray feeder 70 (tray feeder-loader distance L) is equal to or greater than predetermined distance Lref and sets monitoring area as area 2 when tray feeder-loader distance L is less than predetermined distance Lref. As a result, loader 50 can prevent a gap from occurring in the monitoring compared with the case where the monitoring area is switched from area 2 to area 1 after waiting for tray feeder 70 to be detached.

It is to be understood that the present disclosure is not limited to the embodiments described above in any way and may be implemented in various forms as long as the embodiments belong to the technical scope of the present disclosure.

For example, in the embodiment described above, loader control device 59 detects whether safety curtain SC is on with light receiver 56 to determine whether tray feeder 70 (line constituent member) is present on the traveling path of loader 50. However, loader control device 59 receives a mounting signal indicating that the mounting is from mounting control device 29 of component mounting device 20 attached to tray feeder 70 and may determine whether tray feeder 70 is present along the traveling path based on the mounting signal received.

In the embodiment described above, when tray feeder 70 is present on the traveling path of loader 50, loader control device 59 sets the sensor monitoring area as area 1 when tray feeder-loader distance L is equal to or greater than predetermined distance Lref, and sets the sensor monitoring area as area 2 when tray feeder-loader distance L is less than predetermined distance Lref. However, regardless of the length of tray feeder-loader distance L, loader control device 59 may set sensor monitoring area to area 1 when tray feeder 70 is not present on the traveling path of loader 50 and set sensor monitoring area to area 2 when tray feeder 70 is present on the traveling path of loader 50. In this case, the steps of S170 to S190 of the loader control process of FIG. 7 may be omitted. Further, loader control device 59 may temporarily stop the traveling of loader 50 when switching the sensor monitoring area.

In the embodiment described above, the line constituent member is tray feeder 70, but the present disclosure is not limited thereto, and any member may be used as long as the member constitutes a part of the work line and is disposed along the traveling path of loader 50. For example, as shown in FIG. 9, the component mounting system may include extraction device 170 that extracts component mounting device 20 forward so that component mounting device 20 overhangs from base 18. Extraction device 170 includes a pair of left and right Y-axis guide rails 171, which extend in the front-rear direction (Y-direction), provided on top of base 18, and Y-axis slider 172, which slides along Y-axis guide rails 171, provided at the bottom of component mounting device 20. Y-axis slider 172 is connected to extraction motor 173 via a ball screw mechanism (not shown). Extraction device 170 draws out component mounting device 20 by driving and controlling extraction motor 173 with mounting control device 29. Even in such a component mounting system, by providing component mounting device 20 with the same light projector as in the embodiment, it is possible to monitor the space between component mounting device 20 and loader 50 with safety curtain SC. Loader 50 can switch the monitoring area of monitoring sensors 58L, 58R between the normal area 1 and area 2 in which extracted component mounting device 20 is not detected as an interfering object, for example, by determining with light receiver 56 whether safety curtain SC is turned on or off.

In the embodiment described above, the working system is applied to component mounting system 10, but it is applicable to any working system as long as the working system includes multiple modules aligned along the work line and a moving body that moves along the work line and replenishes necessary members to each module.

INDUSTRIAL APPLICABILITY

The present disclosure can be applied to a manufacturing industry of working systems and the like.

REFERENCE SIGNS LIST

10 Component mounting system, 12 Printer, 14 Printing inspector, 16 X-axis rail, 18 Base, 20 Component mounting device, 22 Housing, 23 Board conveyance device, 24 Head, 25 Head moving mechanism, 26 Mark camera, 27 Part camera, 28 Nozzle station, 29 Mounting control device. 30 Tape feeder, 32 Tape reel, 33 Tape feeding mechanism, 34 Positioning pin, 35 Connector, 37 Rail member, 39 Feeder control device, 40 Feeder table, 42 Slot, 44 Positioning hole, 45 Connector, 50 Loader, 51 Loader moving mechanism, 52 X-axis motor, 52b Guide roller, 53 Feeder transfer mechanism, 54 Clamping section, 55a Y-axis motor, 55b Y-axis guide rail, 56 Light receiver, 57 Encoder, 58L, 58R Monitoring sensor 59 Loader control device, 60 Feeder storage container, 62 Board conveyance device, 70 Tray feeder, 72 Lifting and lowering mechanism, 73 Extraction mechanism, 76 Light projector, 79 Feeder control device, 80 Management device, 82 Input device, 84 Display, 170 Extraction device, 171 Y-axis guide rail, 172 Y-axis slider, 173 Extraction motor, S Board.

The invention claimed is:

1. A working system, comprising:
multiple modules constituting a work line;
a moving body configured to move alongside a line in which multiple modules are lined up to replenish necessary members to each of the modules;
a line constituent member constituting a part of the work line, the line constituent member is installable on the moving path of the moving body and has a light projecting section configured to project light toward the moving body along the moving path of the moving body;
a sensor included to the moving body and configured to detect presence of an interfering object,
a light receiving section included to the moving body and configured to receive light from the light projecting section; and
a control section configured to
monitor for the presence of the interfering object within a detection range of the sensor and, in a case of the line constituent member is installed on the moving path of the moving body, the control section stops the movement of the moving body when the interfering object is detected while monitoring for the presence of the interfering object on the moving path to the line constituent member based on a state of light received from the light receiving section,
switch the detection range of the sensor between a first detection range and a second detection range that is smaller than the first detection range, and
set the detection range of the sensor as the first detection range when the line constituent member is not present on the moving path of the moving body, and the control section sets the detection range of the sensor as the second detection range when the line constituent member is present on the moving path of the moving body.

2. The working system of claim 1, wherein the control section determines the line constituent member is not present on the moving path when the light receiving section does not receive light from the light projecting section, and the control section determines the line constituent member is present on the moving path when the light receiving section receives light from the light projecting section.

3. The working system of claim 1, wherein the module includes a component mounting device configured to mount an electronic component on a target object, and the line constituent member includes a component supply device configured to supply an electronic component to the component mounting device.

* * * * *